United States Patent
Heley et al.

(10) Patent No.: US 8,367,304 B2
(45) Date of Patent: Feb. 5, 2013

(54) TECHNIQUES FOR MARKING PRODUCT HOUSINGS

(75) Inventors: Richard Walter Heley, Palo Alto, CA (US); Erming Luo, Cupertino, CA (US); Adam Mittleman, San Francisco, CA (US); John Payne, San Jose, CA (US); Tang Yew Tan, San Francisco, CA (US); Erik Wang, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 411 days.

(21) Appl. No.: 12/475,597

(22) Filed: May 31, 2009

(65) Prior Publication Data

US 2009/0305168 A1 Dec. 10, 2009

Related U.S. Application Data

(60) Provisional application No. 61/121,491, filed on Dec. 10, 2008, provisional application No. 61/059,789, filed on Jun. 8, 2008.

(51) Int. Cl.
*G03F 7/20* (2006.01)
*G03F 7/24* (2006.01)

(52) U.S. Cl. .................................... 430/315
(58) Field of Classification Search ............. 430/315; 438/455
See application file for complete search history.

(56) References Cited

U.S. PATENT DOCUMENTS

| | | | |
|---|---|---|---|
| 2,647,079 A | 7/1953 | Burnham | |
| 3,526,694 A | 9/1970 | Lemelson | |
| 4,269,947 A | 5/1981 | Inata et al. | |
| 4,531,705 A | 7/1985 | Nakagawa et al. | |
| 4,547,649 A | 10/1985 | Butt et al. | |
| 4,564,001 A | 1/1986 | Maeda | |
| 4,993,148 A | 2/1991 | Adachi et al. | |
| 5,417,905 A | 5/1995 | Lemaire et al. | |
| 5,837,086 A | 11/1998 | Leeb et al. | |
| 5,872,699 A | 2/1999 | Nishii et al. | |
| 5,925,847 A | 7/1999 | Rademacher et al. | |
| 6,101,372 A | 8/2000 | Kubo | |
| 6,331,239 B1 | 12/2001 | Shirota et al. | |
| 6,480,397 B1 | 11/2002 | Hsu et al. | |
| 6,574,096 B1 | 6/2003 | Difonzo et al. | |
| 6,966,133 B2 | 11/2005 | Krings et al. | |
| 6,996,425 B2 | 2/2006 | Watanabe | |
| 7,134,198 B2 | 11/2006 | Nakatani et al. | |
| 7,181,172 B2 | 2/2007 | Sullivan et al. | |
| 7,225,529 B2 | 6/2007 | Wang | |

(Continued)

FOREIGN PATENT DOCUMENTS

DE 195 23 112 6/1996
EP 0 114 565 A1 8/1984

(Continued)

OTHER PUBLICATIONS

U.S. Appl. No. 12/234,437, entitled "Method and Systems for Forming Housings from Multi-Layer Materials", filed Sep. 19, 2008.

(Continued)

*Primary Examiner* — Shean Wu

(57) ABSTRACT

Techniques or processes for providing markings on products are disclosed. The markings provided on products can be textual and/or graphic. The techniques or processes can provide high resolution markings on surfaces that are flat or curved. In one embodiment, the products have housings and the markings are to be provided on the housings. For example, the housing for a particular product can include an outer housing surface and the markings can be provided on the outer housing surface.

27 Claims, 8 Drawing Sheets

U.S. PATENT DOCUMENTS

| | | | |
|---|---|---|---|
| 7,459,373 B2* | 12/2008 | Yoo | 438/455 |
| 7,622,183 B2 | 11/2009 | Shirai et al. | |
| 7,691,189 B2 | 4/2010 | En et al. | |
| 8,192,815 B2 | 6/2012 | Weber et al. | |
| 2002/0097440 A1 | 7/2002 | Paricio et al. | |
| 2002/0109134 A1 | 8/2002 | Iwasaki et al. | |
| 2002/0130441 A1 | 9/2002 | Robinson et al. | |
| 2002/0160145 A1 | 10/2002 | Bauhoff | |
| 2003/0006217 A1 | 1/2003 | Dance | |
| 2005/0023022 A1 | 2/2005 | Kriege et al. | |
| 2005/0034301 A1 | 2/2005 | Wang | |
| 2005/0115840 A1 | 6/2005 | Dolan | |
| 2005/0158576 A1 | 7/2005 | Groll | |
| 2006/0055084 A1 | 3/2006 | Yamaguchi et al. | |
| 2006/0066771 A1 | 3/2006 | Hayano et al. | |
| 2006/0105542 A1* | 5/2006 | Yoo | 438/455 |
| 2007/0018817 A1 | 1/2007 | Marmaropoulos et al. | |
| 2007/0045893 A1 | 3/2007 | Asthana et al. | |
| 2007/0053504 A1 | 3/2007 | Sato et al. | |
| 2007/0275263 A1 | 11/2007 | Groll | |
| 2009/0017242 A1 | 1/2009 | Weber et al. | |
| 2009/0104949 A1 | 4/2009 | Sato et al. | |
| 2009/0190290 A1 | 7/2009 | Lynch et al. | |
| 2009/0236143 A1 | 9/2009 | Nakamura | |
| 2009/0260871 A1 | 10/2009 | Weber et al. | |
| 2010/0065313 A1 | 3/2010 | Takeuchi et al. | |
| 2010/0294426 A1* | 11/2010 | Nashner | 156/273.3 |
| 2011/0253411 A1 | 10/2011 | Hum et al. | |

FOREIGN PATENT DOCUMENTS

| | | |
|---|---|---|
| EP | 0 633 585 A | 1/1995 |
| EP | 0 997 958 A1 | 5/2000 |
| GB | 788 329 A | 12/1957 |
| JP | 03 013331 A | 1/1991 |
| JP | 03 138131 A | 6/1991 |
| JP | 06-126192 | 5/1994 |
| JP | 2000-000167 | 1/2000 |
| JP | 2008 087409 A | 4/2008 |
| WO | WO 01/34408 | 5/2001 |
| WO | WO 2006/124279 A2 | 11/2006 |

OTHER PUBLICATIONS

Annerfors et al., "Nano Molding Technology on Cosmetic Aluminum Parts in Mobile Phones", Division of Production and Materials Engineering, LTH, 2007.

U.S. Appl. No. 11/964,652, entitled "Dual Layer Housing", filed Dec. 26, 2007.

U.S. Appl. No. 12/358,647, entitled "Method and Apparatus for Forming a Layer Metal Structure with an Anodized Surface", filed Jan. 23, 2009.

Communication Relating to the Results of the Partial International Search for PCT/US2009/061883 Apr. 7, 2010.

"Thermal Shock Resistant Conformal Coating", Product Data Sheet, Dymax Corporation, Jul. 9, 2007, pp. 1-2.

"Marking Lasers: Marking without Limitations", Trumpf Inc., Sep. 10, 2007, pp. 1-36.

International Preliminary Report for International Application No. PCT/US2009/061883, mailed Jun. 23, 2011.

European Search Report for European Patent Application No. 09802048.0, dated Aug. 3, 2011.

* cited by examiner

TECHNIQUES FOR MARKING PRODUCT HOUSINGS

CROSS-REFERENCE TO RELATED APPLICATIONS

This application is claims priority to U.S. Provisional Patent Application No. 61/059,789, filed Jun. 8, 2008, and entitled "Methods and Systems for Manufacturing an Electronic Device," which is hereby incorporated herein by reference.

This application is also claims priority to U.S. Provisional Patent Application No. 61/121,491, filed Dec. 10, 2008, and entitled "Techniques for Marking Product Housings," which is hereby incorporated herein by reference.

BACKGROUND OF THE INVENTION

1. Field of the Invention

The present invention relates to marking products and, more particularly, marking outer housing surfaces of electronic devices.

2. Description of the Related Art

Consumer products, such as electronic devices, have been marked with different information for many years. For example, it is common for electronic devices to be marked with a serial number, model number, copyright information and the like. Conventionally, such marking is done with an ink printing or stamping process. Although conventional ink printing and stamping is useful for many situations, such techniques can be inadequate in the case of handheld electronic devices. The small form factor of handheld electronic devices, such as mobile phones, portable media players and Personal Digital Assistants (PDAs), requires that the marking be very small. In order for such small marking to be legible, the marking must be accurately and precisely formed. Unfortunately, however, conventional techniques are not able to offer sufficient accuracy and precision. Thus, there is a need for improved techniques to mark products.

SUMMARY OF THE INVENTION

The invention pertains to techniques or processes for providing markings on products. The markings provided on products can be textual and/or graphic. The techniques or processes can provide high resolution markings on surfaces that are flat or curved. In one embodiment, the products have housings and the markings are to be provided on the housings. For example, the housing for a particular product can include an outer housing surface and the markings can be provided on the outer housing surface.

In general, the markings, or annotations, provided on products according to the invention can be textual and/or graphic. The markings can be used to provide a product (e.g., a product's housing) with certain information. The marking can, for example, be use to label the product with various information. When a marking includes text, the text can provide information concerning the product (e.g., electronic device). For example, the text can include one or more of: name of product, trademark or copyright information, design location, assembly location, model number, serial number, license number, agency approvals, standards compliance, electronic codes, memory of device, and the like). When a marking includes a graphic, the graphic can pertain to a logo, a certification mark, standards mark or an approval mark that is often associated with the product. The marking can be used for advertisements to be provided on products. The markings can also be used for customization (e.g., user customization) of a housing of a product.

One aspect described herein provides product marking using photolithography. Here, intermediate material can be adhered to a product surface, then patterned, and then material that is to be used for marking can deposited onto the product surface. Subsequently, any remaining intermediate material can be removed (along with any intermediate material) such that the product thereafter includes the text and/or graphics for the product marketing Another aspect described herein provides product marking using ablation. Here, material that is to be used for marking is deposited onto a product surface and then ablated to yield the text and/or graphics for the product marketing.

The invention can be implemented in numerous ways, including as a method, system, device, or apparatus. Several embodiments of the invention are discussed below.

As a method for depositing material to selected regions of an electronic device housing, one embodiment of the invention can, for example, include at least: adhering a photoresist layer to a housing surface of the electronic device housing; positioning a masking film over the photoresist layer that is adhered to the housing surface, the masking film including a predetermined pattern; exposing the masking film and the photoresist layer to radiation, thereby exposing a portion of the photoresist layer in accordance with the predetermined pattern; removing the masking film from proximity of the photoresist layer; removing the portion of the photoresist layer that has been exposed; depositing a layer of material onto the housing surface, the layer of material being provided on the housing surface where the portion of the photoresist layer has been removed and being provided on a remaining portion of the photoresist layer; and removing the remaining portion of the photoresist layer and the portion of the layer of material provided on the remaining portion of the photoresist layer, thereby retaining the layer of material on the housing surface in accordance with the predetermined pattern.

As a method for depositing material to selected regions of an electronic device housing, another embodiment of the invention can, for example, include at least: forming a mask layer having at least one predetermined opening; adhering the mask layer to an housing surface of the electronic device housing; depositing a layer of material onto the housing surface, the layer of material being provided on the housing surface at least within the predetermined opening of the mask layer; removing the mask layer from the outer surface housing; and removing select portions of the layer of material that are not desired to remain on the outer surface housing.

As a method for depositing material to selected regions of an electronic device housing, another embodiment of the invention can, for example, include at least: depositing a layer of material onto an housing surface of the electronic device housing; and performing laser ablation of select portions of the layer of material on the housing surface to thereby remove the select portions of the of the layer of material that are not desired to remain on the outer surface housing.

As a method for depositing material to selected regions of an electronic device housing, still another embodiment of the invention can, for example, include at least: forming a mask on a housing surface of the electronic device housing, the mask having a predetermined pattern; depositing a layer of material onto the housing surface, the layer of material being provided on the housing surface where the mask has openings; and subsequently removing the mask from the housing surface, thereby retaining the layer of material on the housing surface in accordance with the predetermined pattern.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention pertains to techniques or processes for providing markings on products. The markings provided on products can be textual and/or graphic. The techniques or processes can provide high resolution markings on surfaces that are flat or curved. In one embodiment, the products have housings and the markings are to be provided on the housings. For example, the housing for a particular product can include an outer housing surface and the markings can be provided on the outer housing surface.

In general, the markings, or annotations, provided on products according to the invention can be textual and/or graphic. The markings can be used to provide a product (e.g., a product's housing) with certain information. The marking can, for example, be use to label the product with various information. When a marking includes text, the text can provide information concerning the product (e.g., electronic device). For example, the text can include one or more of: name of product, trademark or copyright information, design location, assembly location, model number, serial number, license number, agency approvals, standards compliance, electronic codes, memory of device, and the like). When a marking includes a graphic, the graphic can pertain to a logo, a certification mark, standards mark or an approval mark that is often associated with the product. The marking can be used for advertisements to be provided on products. The markings can also be used for customization (e.g., user customization) of a housing of a product.

Embodiments of the invention are discussed below with reference to FIGS. 1-6B. However, those skilled in the art will readily appreciate that the detailed description given herein with respect to these figures is for explanatory purposes as the invention extends beyond these limited embodiments.

One aspect described herein provides product marking using photolithography. Here, an intermediate material can be adhered to a product surface, then patterned, and then material that is to be used for marking can deposited onto the product surface. Subsequently, any remaining intermediate material can be removed (along with any of the material used for marking that is provided therein) such that the product thereafter includes the text and/or graphics for the product marketing in accordance with the patterned intermediate material.

Figure 1:
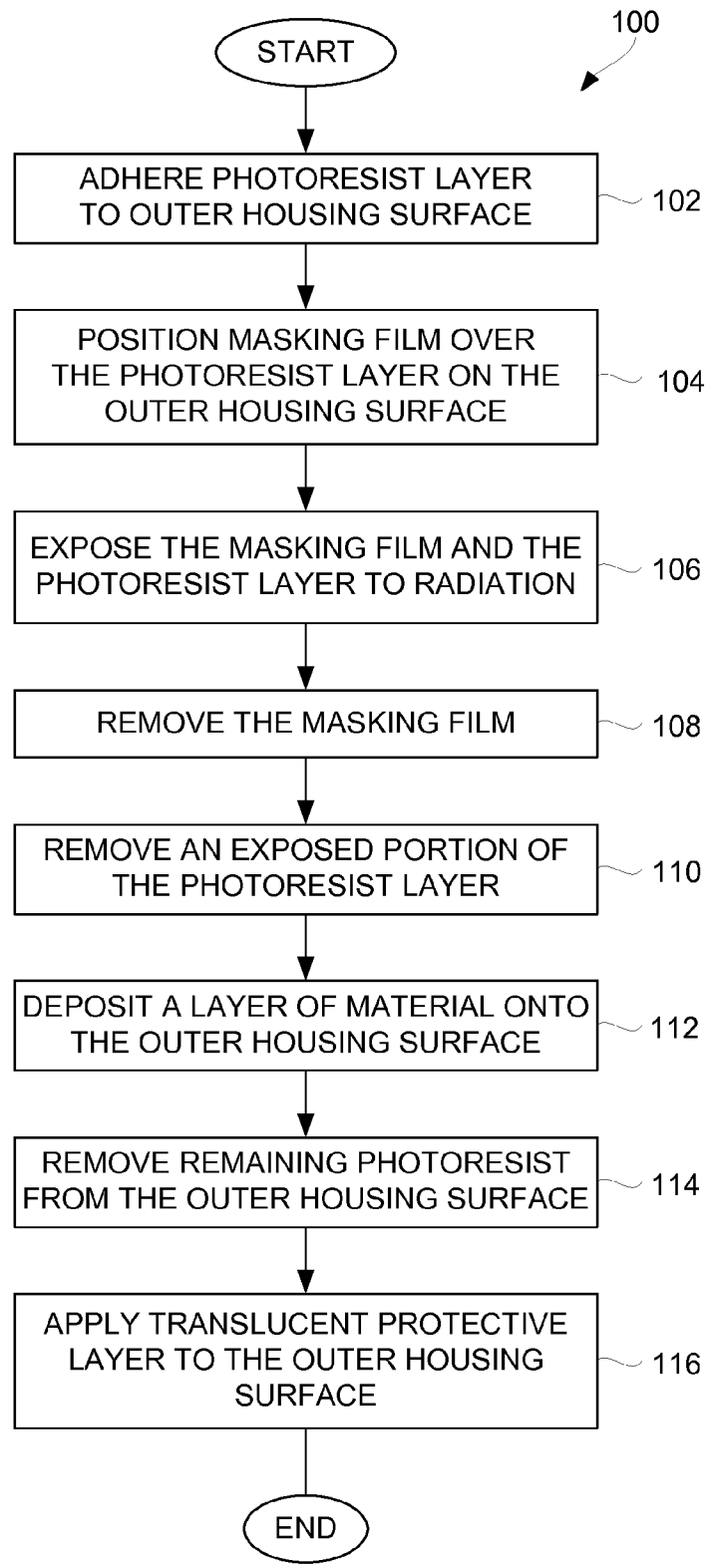
FIG. 1 is a process flow diagram for product marking process according to one embodiment of the invention.

FIG. 1 is a process flow diagram for product marking process 100 according to one embodiment of the invention. The product marking process 100 is, for example, suitable for applying text or graphics to a housing surface (e.g., an outer housing surface) of an electronic device. The product marking process 100 is, in one embodiment, particularly well-suited for applying text and/or graphics to an outer housing surface of a handheld electronic device. Examples of handheld electronic devices include mobile telephones (e.g., cell phones), Personal Digital Assistants (PDAs), portable media players, remote controllers, pointing devices (e.g., computer mouse), game controllers, etc.

The product marking process 100 operates to mark an outer housing surface of an electronic device. The product marking process 1 00 is a multi-step process to form high resolution text or graphics onto the outer housing surface. The outer housing surface can be flat or curved.

Initially, the product marking process 100 adheres 102 a photoresist layer to an outer housing surface. In effect, the photoresist layer is laminated against the outer housing surface (since the outer housing surface is to carry the marking). In one implementation, to ensure that the photoresist layer is tightly sealed against the outer housing surface (at least in the area being processed), one or more heated, conformable rollers can be used to apply heat and pressure. The conformable nature of the one or more roller is advantageous when the outer housing surface is curved. In this embodiment, the masking film can be a dry film photoresist. In an alternative embodiment, the masking film can be a wet film photoresist, which can be positioned 104 on the photoresist layer using spin-coating.

Next, a masking film can be positioned 104 over the photoresist layer on the outer housing surface. The masking film and the photoresist later can then be exposed 106 to radiation. For example, the radiation can be ultraviolet (UV) radiation that is used to activate portions of the photoresist layer. More particularly, the masking film has a predetermined pattern for the text or graphics to be applied to the outer housing surface. Hence, by applying the masking film over at the photoresist layer, only selected portions of the photoresist layer are activated by the radiation. In other words, the masking film allows the radiation to pass through to activate the photoresist layer in only the selected portions which pertain to the predetermined pattern. For example, the predetermined pattern of the masking film can be considered an inverse stencil in that is serves to block the radiation in regions where marking is not to be provided. In one implementation, the masking film can be a silver-halide thin film.

Next, the masking film can be removed 108. Further, an exposed (i.e., activated) portion of the photoresist layer can be removed 110. The removal of the photoresist layer by performed by a chemical washing operation. In one implementation, the chemical washing can use a potassium carbonate or sodium carbonate solution.

Thereafter, a layer of material can be deposited 112 onto the outer housing surface. For example, the layer of material can be deposited 112 by a deposition process, such as sputtering. One suitable process for the deposition of the layer of material is a Physical Vapor Deposition (PVD) process. The layer of material being deposited can very depending upon application. However, one suitable layer of material is a layer of metal, such as silver. Alternatively, the layer of material can be a layer of tin or other material that can be applied with a deposition process.

Next, any remaining photoresist can be removed 114 from the outer housing surface. The layer of material that is deposited on the remaining photoresist is also removed as the underlying photoresist is removed. The removal of the photoresist layer by performed by a chemical washing operation. In one implementation, the chemical washing can use a relatively weak solution of sodium hydroxide (NaOH).

Thereafter, if desired, a translucent protective layer can be applied 116 to the outer housing surface so as to cover and protect the remaining layer of material that provides the graphical elements and/or textual elements on the outer housing surface that serve to mark the product. For example, the translucent protective layer can be a layer of acrylic. Following the block 116, the product marking process 100 can end.

In one embodiment, at least a portion of product housing can be formed of a plastic or resin, such as polycarbonate. The marking can use a material that is metal (e.g., silver), which can be reflective. The resulting marking on the product housing is thus able to be provided in high resolution on a product's housing.

In one particular embodiment, the processing parameters for one suitable implementation can, for example, be as follows:

Lamination of a photoresist layer to a housing surface
    Lamination speed: 53 rpm
    Laminating temp: 100 degrees Celsius
    Lamination pressure: 5 Kg/cm2
    Roller hardness: ≦68
    Pressure uniformity
    Roller cleaning (with Isopropyl Alcohol), e.g., to prevent press in dents Exposure
    Exposure Energy: 78 mj/cm2
    Resist: 1 (e.g., in case of a white housing)
    Main vacuum: <−700 KPa
    Phototool Dmax: >4.5
    Phototool: No Emulsion Protective Layer
    Exposure vacuum foil: Using clear film Polyethylene Teraphthalate (PET)
    Change white light to yellow light
    Avoid scratch and cleaning tray
    Avoid paint and protect rustiness using tape
    Cleaning and stick roller Developing
    Sodium carbonate: 0.8%~0.9%
    Break point: 50%-60%
    Pressure: 1.8 Kg/cm2
    Speed: 4.7 m/min (3 dev chamber)
    Hard Water rinse: 200-250 ppm
    Rinse (e.g., de-ionized water rinse Stripping
    1. Sputter silver (Thickness 20 nm)
        Sodium hydroxide: 1.5%
        Solution temperature: 50 degrees Celsius
        Stripping time: 5'40"~6'
        Stripping time can be reduced with other solutions
    2. Sputter Aluminum (Thickness 50 nm)

FIGS. 2A-2H are diagrams detailing a product marking process according to one embodiment of the invention. The product marking process shown in FIGS. 2A-2H pertains to one embodiment of the product marking process 100 illustrated in FIG. 1.

Figure 2A:
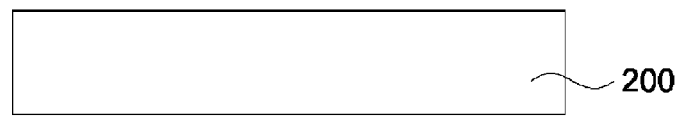
FIGS. 2A-2H are diagrams detailing a product marking process according to one embodiment of the invention.

FIG. 2A is a diagram illustrating a housing portion 200. The housing portion 200 can represent a portion of a product housing, such as an outer housing of an electronic device.

Figure 2B:
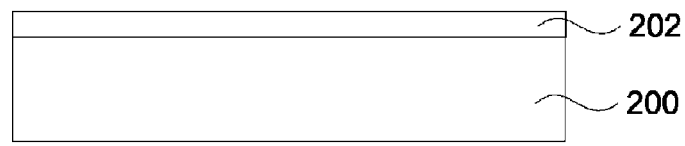

FIG. 2B is a diagram illustrating the housing portion 200 having a photoresist layer 202 applied thereon.

Figure 2C:
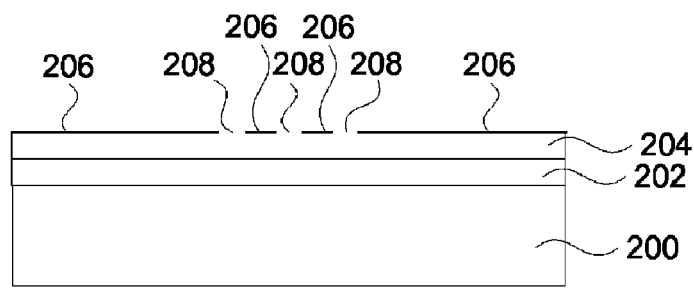

FIG. 2C is a diagram illustrating a masking film 204 applied over the photoresist layer 202 on the housing portion 200. The masking film 204 includes opaque sections 206 and translucent sections 208. The translucent sections 208 can provide a predetermined pattern for marking of the product housing.

Figure 2D:
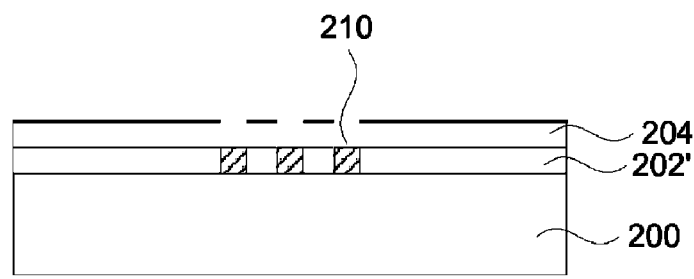

FIG. 2D is a diagram illustrating the housing portion 200 after having been exposed to radiation. For example, ultraviolet (UV) radiation can be directed at the photoresist layer 202 on the housing portion 200 through the masking film 204. As a result, the exposed photoresist layer 202' includes exposed photoresist regions 210 below the translucent sections 208 in the masking film 204.

Figure 2E:
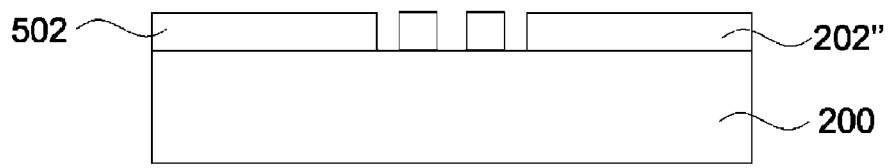

FIG. 2E is a diagram illustrating the housing portion 200 having the remaining photoresist layer 202". Here, the remaining photoresist layer 202" results from removal of the masking film 204 and those regions 211 of the photoresist layer 202' that were activated by the exposure to radiation.

Figure 2F:
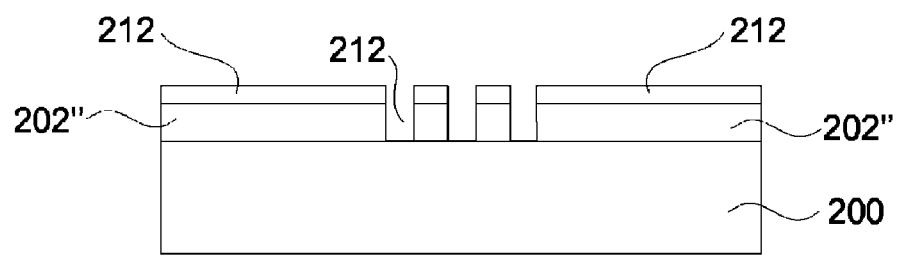

FIG. 2F is a diagram illustrating the housing portion 200 after a layer of material 212 is applied over the remaining photoresist layer 202". The layer of material 212 is applied not only over the remaining portion of the photoresist layer 202" but also directly over the outer surface of the housing portion 200 where the photoresist layer 202 has been removed. The layer of material 212 can, for example, be applied through a sputtering technique, such as through Physical Vapor Deposition (PVD). Also, as an example, the layer of material can be a metal.

Figure 2G:
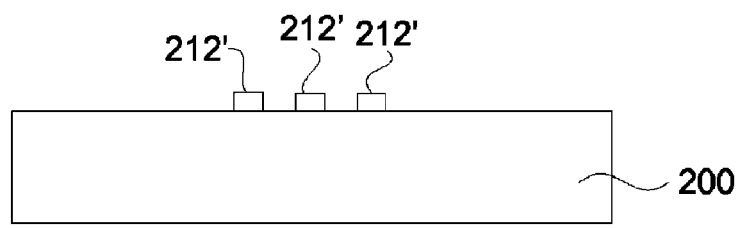

FIG. 2G is a diagram illustrating the housing portion 200 after the remaining photoresist layer 202" is removed. Here, the layer of material 212 applied over the remaining portion of the photoresist layer 202" is also removed. However, the portion of the layer of material 212' that remains is that portion that has been provided directly over the outer surface of the housing portion 200.

Figure 2H:
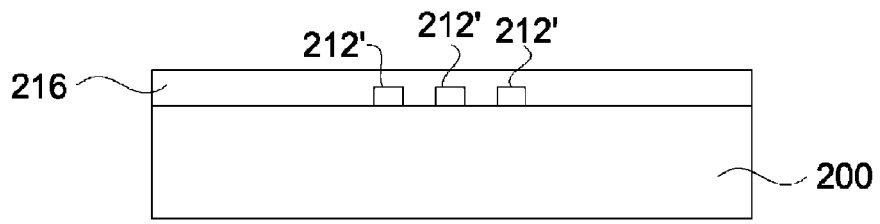

FIG. 2H is a diagram illustrating the housing portion 200 after a protective coating 216 is applied on the outer surface of the housing portion 200 over the remaining portion of the layer of material 212'.

FIGS. 3A-3H are diagrams detailing a product marking process according to another embodiment of the invention. The product marking process shown in FIGS. 3A-3H pertains to one embodiment of the product marking process 100 illustrated in FIG. 1.

Figure 3A:
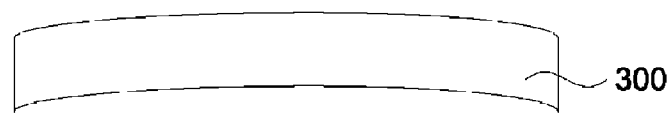
FIGS. 3A-3H are diagrams detailing a product marking process according to another embodiment of the invention.

FIG. 3A is a diagram illustrating a housing portion 300. The housing portion 300 can represent a portion of a product housing, such as an outer housing of an electronic device. In this embodiment, the housing portion 300 is curved. Marking is rendered more complicated when the surface to be marked has curvature. However, the product marking process according to the invention is suitable for use on flat, curved or complex surfaces.

Figure 3B:
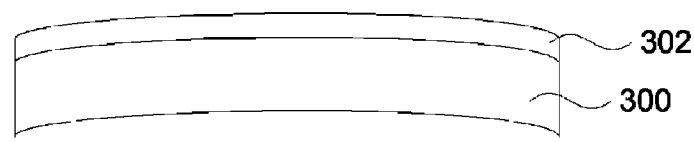

FIG. 3B is a diagram illustrating the housing portion 300 having a photoresist layer 302 applied thereon.

Figure 3C:
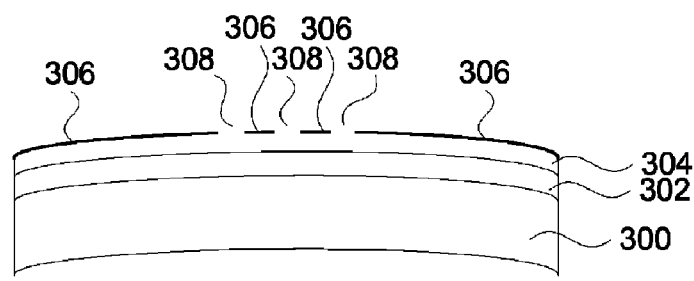

FIG. 3C is a diagram illustrating a masking film 304 applied over the photoresist layer 302 on the housing portion 300. The masking film 304 includes opaque sections 306 and translucent sections 308. The translucent sections 308 can provide a predetermined pattern for marking of the product housing.

Figure 3D:
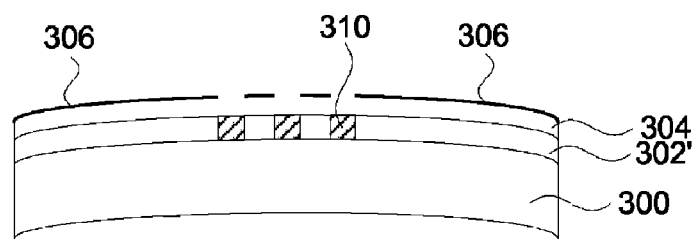

FIG. 3D is a diagram illustrating the housing portion 300 after having been exposed to radiation. For example, ultraviolet (UV) radiation can be directed at the photoresist layer 302 on the housing portion 300 through the masking film 304. As a result, the exposed photoresist layer 302' includes exposed photoresist regions 310 below the translucent sections 308 in the masking film 304.

Figure 3E:
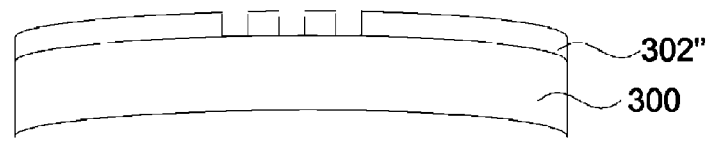

FIG. 3E is a diagram illustrating the housing portion 300 having the remaining photoresist layer 302". Here, the remaining photoresist layer 302" results from removal of the masking film 304 and those regions 311 of the photoresist layer 302' that were activated by the exposure to radiation.

Figure 3F:
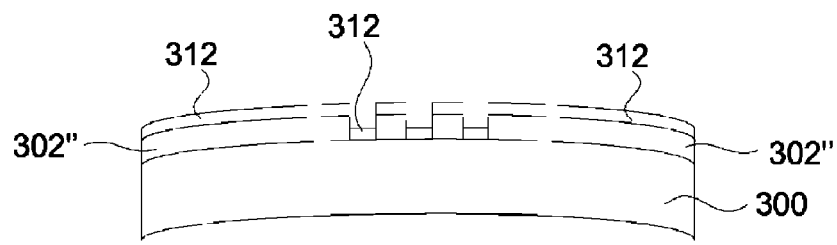

FIG. 3F is a diagram illustrating the housing portion 300 after a layer of material 312 is applied over the remaining photoresist layer 302''. The layer of material 312 is applied not only over the remaining portion of the photoresist layer 302'' but also directly over the outer surface of the housing portion 300 where the photoresist layer 302 has been removed. The layer of material 312 can, for example, be applied through a sputtering technique, such as through Physical Vapor Deposition (PVD). Also, as an example, the layer of material can be a metal.

Figure 3G:
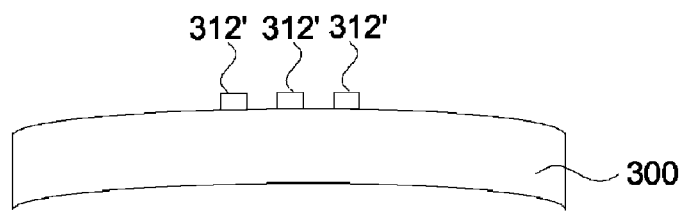

FIG. 3G is a diagram illustrating the housing portion 300 after the remaining photoresist layer 302'' is removed. Here, the layer of material 312 applied over the remaining portion of the photoresist layer 302'' is also removed. However, the portion of the layer of material 312' that remains is that portion that has been provided directly over the outer surface of the housing portion 300.

Figure 3H:
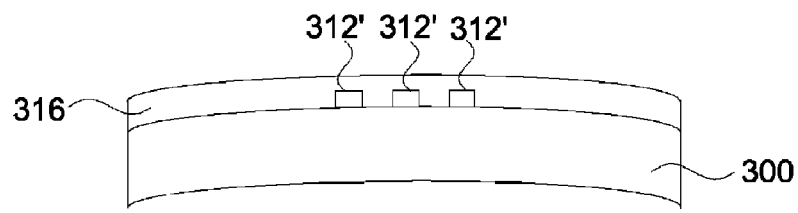

FIG. 3H is a diagram illustrating the housing portion 300 after a protective coating 316 is applied on the outer surface of the housing portion 300 over the remaining portion of the layer of material 312'.

In the product marking process 100 illustrated in FIG. 1, a photolithographic mask is used, where a photoresist layer is adhered to an outer surface housing. However, in other embodiment, a mask that performs a similar function can be formed from different techniques. As one example, a mask can be pad printed on the outer surface housing. As another example, a mask can be silk screened onto the outer surface housing. As still another example, a mask can be printed, such as with an ink jet printing device, onto the outer surface housing.

Another aspect described herein provides product marking using ablation. Here, material that is to be used for marking is deposited onto a product surface and then selectively ablated to yield the text and/or graphics for the product marketing.

Figure 4:
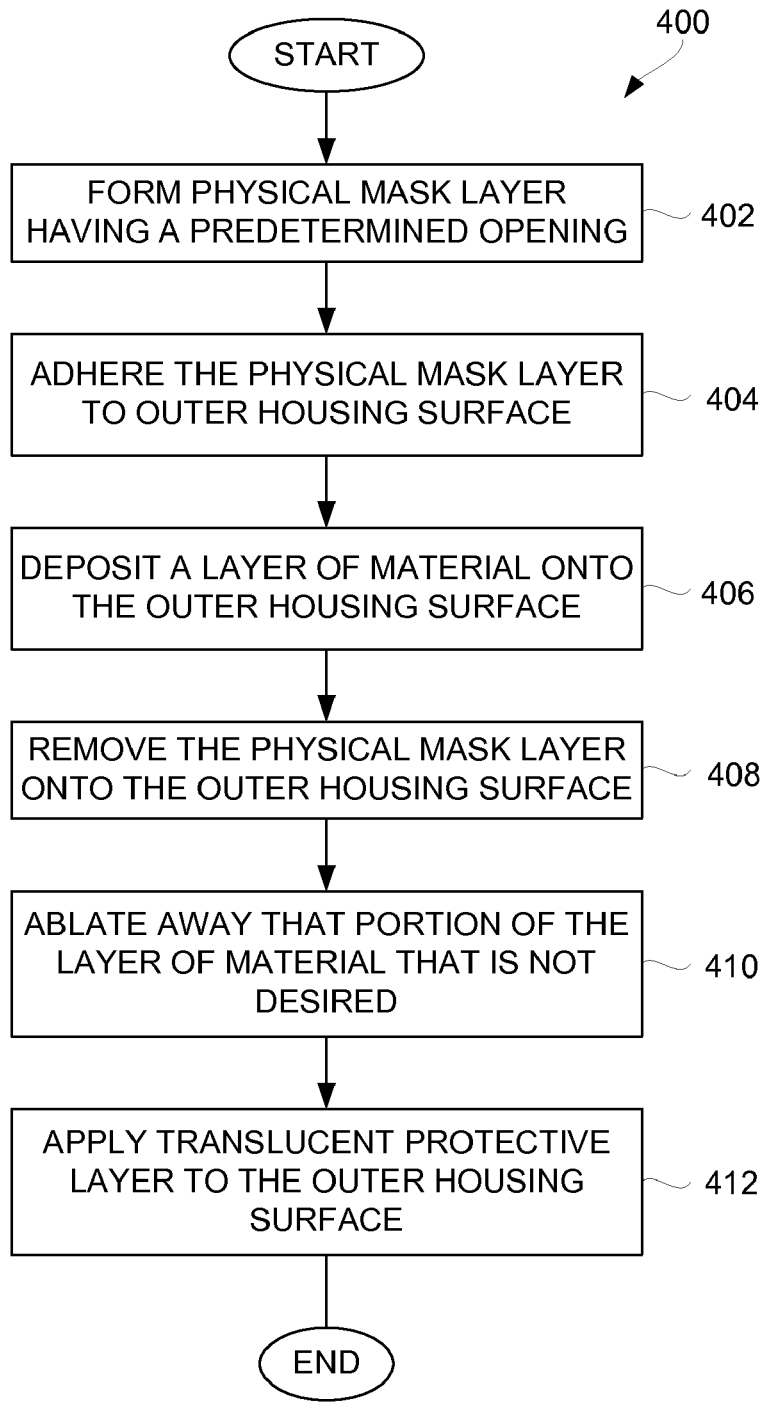
FIG. 4 is a process flow diagram for a product marking process according to another embodiment of the invention.

FIG. 4 is a process flow diagram for a product marking process 400 according to another embodiment of the invention. In this embodiment, the product marking process 400 can mark a housing of an electrical device. For example, the product marking process 400 can be used to form text and/or graphics onto a housing surface, such as an outer housing surface, of an electrical device.

The product marking process 410 initially forms 402 a physical mask layer having at least one predetermined opening. The predetermined opening is, for example, an opening that surrounds a region were text or graphics is to be applied to the outer housing surface. In other words, the predetermined opening is oversized as compared to the region where text or graphic is to be applied on the outer housing surface. The physical mask layer can be implemented by a film having at die cut for the predetermined opening. In the event that the physical mask layer has more than one predetermined opening, the physical mask layer can have a die cut for each of the predetermined openings.

After the physical mask has been formed 402, the physical mask layer can be adhered 404 to the outer housing surface. In one implementation, the physical mask layer can be adhered 404 to the outer housing surface through use of an adhesive. For example, the physical mask can have an adhesive backing.

Next, a layer of material can be deposited 406 onto the outer housing surface. For example, a deposition technique, such as sputtering, can be used to deposit 406 a layer of material onto the outer housing surface. In one implementation, the deposition technique uses a Physical Vapor Deposition (PVD) process. The layer of material being deposited 406 is the material that is to form the marking. For example, the layer of material can be a layer of metal, such as aluminum. Thereafter, the physical mask layer can be removed 408 from the outer housing surface.

After the physical mask layer has been removed 408, the product marking process 400 can ablate 410 away portions of the layer of material that are not desired. The ablation 410 can utilize a laser to precisely remove portions of the layer of material that has been deposited 406 onto the outer housing surface. The ablation 410 can thus form specific graphical elements and/or text elements into the layer of material by ablation 410 of those portions of the layer of material that are not needed to represent the desired graphical elements and/or textual elements that are to remain on the outer housing surface. In one implementation, the laser performing the ablation 410 is a YV04 laser (e.g., 1064 nanometer (NM)). Through proper control of the laser, the ablation 410 of undesired portion of the layer of material can be removed without damaging the surface of the outer surface housing.

Subsequently, a translucent protective layer can be applied 412 to the outer housing surface. Although the translucent protective layer is not required, the translucent protective layer can serve to protect the remaining portion of the layer of material that is used to represent the one or more desired graphical elements and/or textual elements on the outer housing surface. For example, the translucent protective layer can be a layer of acrylic. Following the block 412, the product marking process 400 can end.

It should be noted that the use of a physical mask in the product marking process 400 is optional. The physical mask serves to confine the area(s) where ablation is to be performed. Hence, in one embodiment, the product marking can be performed with simply operations 406 and 410 of the product marking process 400, though this entails additional ablation.

FIGS. 5A-5E are diagrams detailing a product marking process according to one embodiment of the invention. The product marking process shown in FIGS. 5A-5D pertains to one embodiment of the product marking process 400 illustrated in FIG. 4.

Figure 5A:
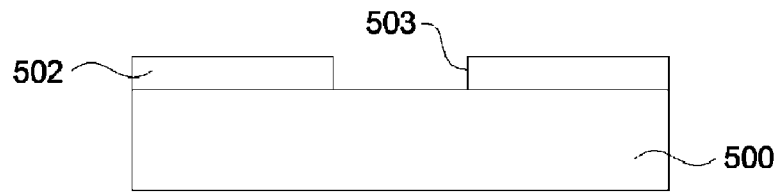
FIGS. 5A-5E are diagrams detailing a product marking process according to one embodiment of the invention.

FIG. 5A is a diagram illustrating a housing portion 500. The housing portion 500 can represent a portion of a product housing, such as an outer housing of an electronic device. A mask layer 502 is attached to the housing portion 500. The mask layer has at least one predetermined opening 503 that defines a region where marking of the outer housing is to be performed.

Figure 5B:
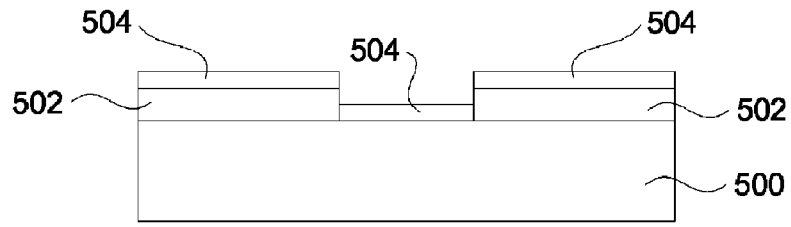

FIG. 5B is a diagram illustrating the housing portion 500 having the mask layer 502 as well as a layer of material 504. The layer of material 504 is applied over the predetermined opening 503 in the mask layer 502 and may also be applied over some or all of the mask layer 502.

Figure 5C:
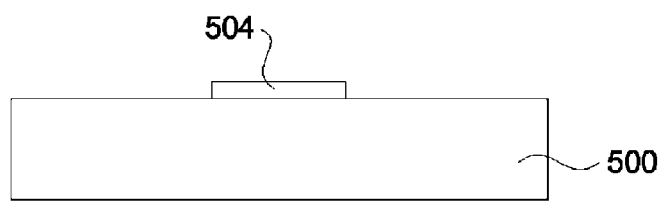

FIG. 5C is a diagram illustrating the housing portion 500 having a remaining portion of the layer of material 504 that results after the mask layer 502 is removed from the housing portion 500. The remaining portion of the layer of material 504 corresponds to the predetermined pattern.

Figure 5D:
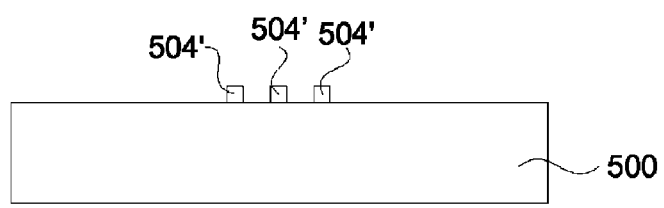

FIG. 5D is a diagram illustrating the housing portion 500 after the remaining portion of the layer of material 504 is abated to remove unwanted areas. As shown in FIG. 5D, after the ablation, the layer of material 504 is now converted to specific marking elements 504'. The specific marking elements 504' can pertain to text and/or graphic elements that are formed from the layer of material 504 using laser ablation.

Figure 5E:
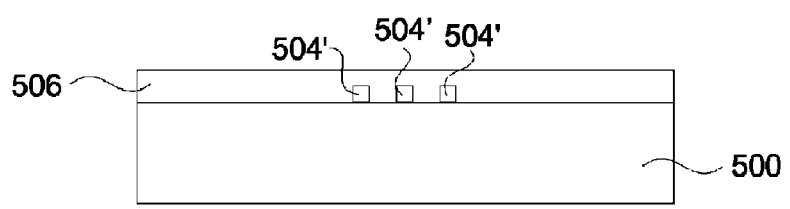

FIG. 5E is a diagram illustrating the housing portion 500 after a protective coating 506 is applied on the outer surface of the housing portion 500 over the specific marking elements 504' that have been formed in the layer of material 504.

Figure 6A:
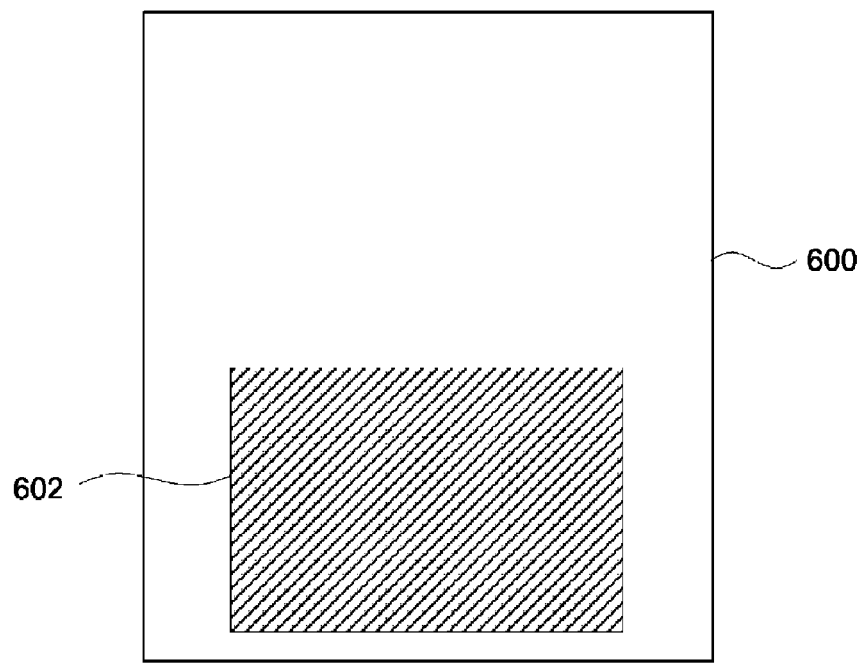
FIGS. 6A and 6B are diagrams illustrating exemplary marking of a product in accordance with a product marking process.
Figure 6B:
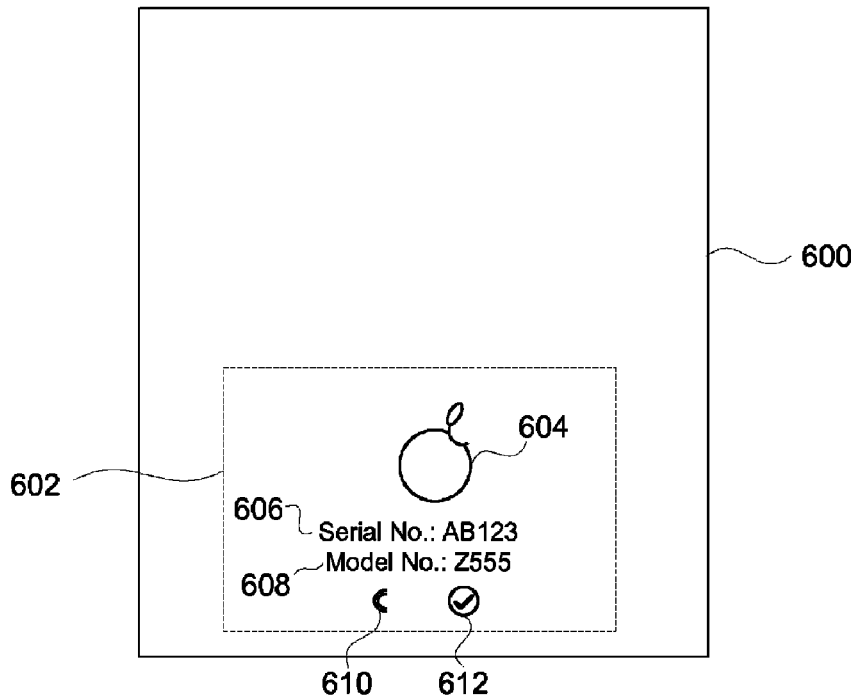

FIGS. 6A and 6B are diagrams illustrating exemplary marking of a product in accordance with a product marking process, such as the product marking process shown in FIGS. 5A-5E or the product marking process 400 illustrated in FIG. 4.

FIG. 6A illustrates a product housing 600 according to one embodiment. The product housing 600 being illustrated can represent one surface, such as back surface, of a handheld electronic device. A predetermined region 602 of the illustrated surface can be coated or covered with a layer of material to be used for marking. As noted above, a masking layer can be used to confine the layer of material to the predetermined region 602.

FIG. 6B illustrates the product housing 600 after the layer of material in the predetermined region 602 has been ablated away to yield the desired labeling. In this example, the labeling includes a logo graphic 604, serial number 606, model number 608, and certification/approval marks 610 and 612.

In one embodiment, the product marking techniques discussed herein can be used to provide markings on a portable electronic device. The portable electronic device can further be a hand-held electronic device. The term hand-held generally means that the electronic device has a form factor that is small enough to be comfortably held in one hand. A hand-held electronic device may be directed at one-handed operation or two-handed operation. In one-handed operation, a single hand is used to both support the device as well as to perform operations with the user interface during use. In two-handed operation, one hand is used to support the device while the other hand performs operations with a user interface during use or alternatively both hands support the device as well as perform operations during use. In some cases, the hand-held electronic device is sized for placement into a pocket of the user. By being pocket-sized, the user does not have to directly carry the device and therefore the device can be taken almost anywhere the user travels (e.g., the user is not limited by carrying a large, bulky and often heavy device).

Additional information on product marking as well as other manufacturing techniques and systems for electronic devices are contained in U.S. Provisional Patent Application No. 61/059,789, filed Jun. 8, 2008, and entitled "Methods and Systems for Manufacturing an Electronic Device," which is hereby incorporated herein by reference.

The various aspects, features, embodiments or implementations of the invention described above can be used alone or in various combinations.

Different aspects, embodiments or implementations may, but need not, yield one or more of the following advantages. One advantage is that high precision markings can be provided to product housings. As an example, the marking being provided can have a resolution whereby thirty (30) micron line widths can be achieved. Another advantage is that the marking techniques are effective for surfaces that are flat or curved. Another advantage is that the marking techniques have good adhesion characteristics to product housings, such as plastic housings. Still another advantage is that markings can be formed that are metallic and reflective for superior visual appearance. Yet still another advantage is that one or several markings can be provided to one or more distinct areas of a product's housing. The various markings can be efficiently provided in a sequential or concurrent manner.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A method for depositing material to selected regions of an electronic device housing to thereby provide a marking on the electronic device housing, said method comprising:
    forming a mask layer having at least one predetermined opening;
    adhering the mask layer to an housing surface of the electronic device housing;
    depositing a layer of material onto the housing surface, the layer of material being provided on the housing surface at least within the predetermined opening of the mask layer;
    removing the mask layer from the outer surface housing; and
    removing select portions of the layer of material that are not desired to remain on the outer surface housing,
    wherein a remaining portion of the layer of material that remains on the outer surface housing serves to mark on the housing surface of the electronic device housing.

2. A method as recited in claim 1, wherein said method further comprises:
    subsequently applying a translucent protective layer to the housing surface so as to cover at least the remaining portions of the layer of material that remain on the outer surface housing.

3. A method as recited in claim 1, wherein said removing of the select portions of the layer of material comprises performing laser ablation of the select portions of the layer of material on the housing surface to thereby remove the select portions of the of the layer of material that are not desired to remain on the outer surface housing.

4. A method as recited in claim 1, wherein the remaining portions of the layer of material retained on the housing surface include text and graphics.

5. A method as recited in claim 1, wherein the remaining portions of the layer of material retained on the housing surface include at least one graphic, the at least one graphic being a logo, a certification mark or an approval mark.

6. A method as recited in claim 1, wherein the predetermined opening is oversized as compared to an area for the remaining portions of the layer of materials that remain on the outer surface housing.

7. A method as recited in claim 1, wherein the layer of material is a layer of metal.

8. A method as recited in claim 7, wherein the layer of metal is a layer of aluminum.

9. A method as recited in claim 1, wherein the electronic device housing is a handheld, portable electronic device.

10. A method as recited in claim 1, wherein the housing surface is an outer housing surface.

11. A method for depositing material to selected regions of an electronic device housing to thereby provide a marking on the electronic device housing, said method comprising:
    forming a mask on a housing surface of the electronic device housing, the mask having a predetermined pattern;
    depositing a layer of material onto the housing surface, the layer of material being provided on the housing surface where the mask has one or more openings; and
    subsequently removing the mask from the housing surface, thereby retaining the layer of material on the housing surface in accordance with the predetermined pattern, wherein the layer of material providing the housing surface that is retained in the predetermined pattern provides the marking on the electronic device housing.

12. A method as recited in claim 11, wherein the mask is formed of photoresist.

13. A method as recited in claim 11, wherein said forming of the mask comprises ink jet printing the mask onto the housing surface.

14. A method as recited in claim 11, wherein said forming of the mask comprises pad printing the mask onto the housing surface.

15. A method as recited in claim 11, wherein said forming of the mask comprises silk screening the mask onto the housing surface.

16. A method as recited in claim 11, wherein the remaining portions of the layer of material retained on the housing surface include text and graphics.

17. A method as recited in claim 11, wherein the remaining portions of the layer of material retained on the housing surface include at least one graphic, the at least one graphic being a logo, a certification mark or an approval mark.

18. A method as recited in claim 11, wherein the layer of material is a layer of metal.

19. A method as recited in claim 18, wherein the layer of metal is a layer of aluminum.

20. A method as recited in claim 11, wherein the electronic device housing is a handheld, portable electronic device.

21. A method as recited in claim 11, wherein the housing surface is an outer housing surface.

22. A method as recited in claim 11,
wherein the electronic device housing is a handheld, portable electronic device,
wherein the housing surface is an outer housing surface.

23. A method as recited in claim 22, wherein the remaining portions of the layer of material retained on the housing surface include at least one graphic.

24. A method as recited in claim 23, wherein the at least one graphic comprising a logo.

25. A method as recited in claim 22, wherein the layer of material comprises a layer of metal.

26. A method as recited in claim 25, wherein said removing of the select portions of the layer of material comprises performing laser ablation of the select portions of the layer of material on the housing surface to thereby remove the select portions of the of the layer of material that are not desired to remain on the outer surface housing.

27. A method as recited in claim 26, wherein said method further comprises:
subsequently applying a translucent protective layer to the housing surface so as to cover at least the remaining portions of the layer of material that remain on the outer surface housing.

\* \* \* \* \*

UNITED STATES PATENT AND TRADEMARK OFFICE
CERTIFICATE OF CORRECTION

PATENT NO.         : 8,367,304 B2                                              Page 1 of 1
APPLICATION NO.    : 12/475597
DATED              : February 5, 2013
INVENTOR(S)        : Heley et al.

It is certified that error appears in the above-identified patent and that said Letters Patent is hereby corrected as shown below:

In the Claims

Col. 10, line 34 "of the of the" should be --of the--
Col. 12, line 18 "of the of the" should be --of the--

Signed and Sealed this
Twentieth Day of May, 2014

Michelle K. Lee
*Deputy Director of the United States Patent and Trademark Office*